(12) United States Patent
Kim et al.

(10) Patent No.: US 7,015,560 B2
(45) Date of Patent: Mar. 21, 2006

(54) LIGHT-RECEIVING DEVICE, METHOD FOR MANUFACTURING THE SAME, AND OPTOELECTRONIC INTEGRATED CIRCUIT COMPRISING THE SAME

(75) Inventors: Jun-young Kim, Gyeonggi-do (KR); Byoung-lyong Choi, Seoul (KR); Eun-kyung Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 10/779,741

(22) Filed: Feb. 18, 2004

(65) Prior Publication Data

US 2004/0164370 A1    Aug. 26, 2004

(30) Foreign Application Priority Data

Feb. 25, 2003   (KR) .................... 10-2003-0011639

(51) Int. Cl.
*H01L 31/075*       (2006.01)
(52) U.S. Cl. .................. 257/457; 257/449; 257/458; 438/57; 438/98; 438/570
(58) Field of Classification Search ............... 257/449, 257/457–458; 438/57, 98, 570
See application file for complete search history.

(56) References Cited

U.S. PATENT DOCUMENTS

| | | | | |
|---|---|---|---|---|
| 3,928,866 A | * | 12/1975 | Digoy | 257/430 |
| 4,329,625 A | * | 5/1982 | Nishizawa et al. | 315/158 |
| 4,377,817 A | * | 3/1983 | Nishizawa et al. | 257/258 |
| 5,466,948 A | * | 11/1995 | Worley | 257/3 |

FOREIGN PATENT DOCUMENTS

| | | | |
|---|---|---|---|
| JP | 58061682 A | * | 4/1983 |
| KR | P1999-008434 | | 1/1999 |

* cited by examiner

*Primary Examiner*—Allan R. Wilson
(74) *Attorney, Agent, or Firm*—Buchanan Ingersoll PC (57) ABSTRACT

A light-receiving device, a method for manufacturing the same, and an optoelectronic integrated circuit including the same are provided. The light-receiving device includes a substrate; an intrinsic region formed on the substrate; a first region formed to a shallow depth in the intrinsic region; and a second region formed to a deep depth in the intrinsic region and distanced from the first region, wherein the first and second regions are doped with different conductivity types. The light-receiving device can shorten the transit time of holes with slow mobility. Therefore, no response delay occurs, and thus, a high response speed can be accomplished.

51 Claims, 8 Drawing Sheets

LIGHT-RECEIVING DEVICE, METHOD FOR MANUFACTURING THE SAME, AND OPTOELECTRONIC INTEGRATED CIRCUIT COMPRISING THE SAME

BACKGROUND OF THE INVENTION

This application claims the priority of Korean Patent Application No. 2003-11639, filed on Feb. 25, 2003, in the Korean Intellectual Property Office, the disclosure of which is incorporated herein in its entirety by reference.

1. Field of the Invention

The present invention relates to a light-receiving device with a high response speed and a method for manufacturing the same. The present invention also relates to an optoelectronic integrated circuit (OEIC) comprising the light-receiving device.

2. Description of the Related Art

An advantage of using a silicon semiconductor substrate is that it ensures excellent reliability and allows highly integrated density in integrating a logic device, an operation device, and a drive device on the substrate. Also, a silicon semiconductor material can be used in fabrication of a highly integrated circuit at a much lower cost than a compound semiconductor material, due to use of an inexpensive silicon. Therefore, silicon (Si) is most often used as a basic material in integrated circuit fabrication.

Due to a light-receiving device made of silicon, various optoelectronic integrated circuits (OEICs) such as a silicon optical bench with a monitor photodetector (MPD) for monitoring an optical power from a light source and an optical module for optical communication or optical pick-up with modulated light source and photodetector can be obtained.

In order for realizing OEICs and realizing further various applications, the light-receiving device must satisfy a high response speed.

A response speed in a light-receiving device, that is, a photodetector, depends on a transit time of holes and electrons in an intrinsic region (a depletion region) and a diffusion time of holes and electrons outside a doped region.

Diffusivity of carriers in silicon can be obtained according to the Einstein relation as represented by Equation 1:

$$D/\mu = kT/q,$$ Equation 1 wherein, D is diffusivity of carriers, $\mu$ is mobility of carriers, k is the Boltzmann constant, T is a temperature (K), and q is a charge.

In an intrinsic silicon (Si), the mobility of electrons is 1350 $cm^2$/Vs (where, V is a voltage (volt) and s is a time (second)) at room temperature (300 K) and the mobility of holes is 450 $cm^2$/Vs. The mobility of holes is much less than that of electrons. Therefore, it can be seen from the Einstein relation that the diffusivity of holes is less than that of electrons.

While a built-in potential (caused by an electric field generated in an intrinsic region without an external voltage) is increased for increasing the intensity of an electric field applied to an intrinsic region, and a doping concentration is increased for enhancing the electroconductivity of a doping layer, the mobility of holes further decreases with increase of the built-in potential and doping concentration. Therefore, in order to accomplish a high response speed in a PIN photodetector, the thickness of a P region, through which holes with slow mobility travel, is required to be reduced.

Figure 1:
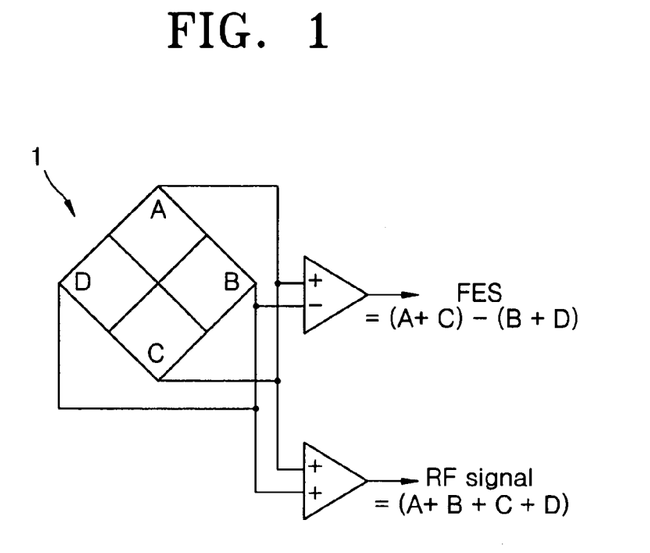
FIG. 1 is a view of an example of a 4-division photodetector for optical pick-up.

Meanwhile, in an optical pick-up, a photodetector divided into several segments as shown in FIG. 1 is used to reproduce information recorded in optical information storage media, for example, an optical disc such as compact disc (CD), digital versatile disc (DVD), and next generation DVD (e.g. Blu-ray disc (BD) and/or Advanced optical disc (AOD) and detect an error signal, for example, a focus error signal and a tracking error signal during recording and/or reproduction operation. FIG. 1 shows a 4-division photodetector for optical pick-up, but a photodetector for optical pick-up can have various division structures.

Referring to FIG. 1, when A, B, C, and D indicate segments of the 4-division photodetector 1 and respective signals detected at each segment, as well known in the optical pick-up pertinent art field, a focus error signal (FES) according to the astigmatism method and an information reproducing signal (RF signal) are equal to (A+C)−(B+D) and A+B+C+D, respectively. A tracking error signal (TES) according to the push-pull method is equal to (A+B)−(C+D).

As described above, a photodetector having a plurality of segments is used in optical pick-up. As a large storage capacity and high-speed data processing of optical information storage media are required, use of a photodetector with a high response speed and a low noise for excellent sensitivity is required in an optical pick-up. However, a conventional photodetector with an n-division structure cannot satisfy a high response speed and a low noise. Therefore, fabrication of various devices requiring high integrity, for example, fabrication of an integral structure of a photodetector with a photodetector integrated circuit (PDIC) is faced with many problems.

SUMMARY OF THE INVENTION

The present invention provides a light-receiving device with a high response speed and a low noise for excellent sensitivity and a method for manufacturing the same. The present invention also provides an optoelectronic integrated circuit comprising the light-receiving device.

According to an aspect of the present invention, there is provided a light-receiving device comprising: a substrate; an intrinsic region formed on the substrate; a first region formed to a relatively shallow depth in the intrinsic region; and a second region formed to a relatively deep depth in the intrinsic region and distanced from the first region, wherein the first and second regions are doped with different conductivity types.

According to specific embodiments of the present invention, the first region may be doped with p+ type and comprise thereon an electrode patterned in such a way as to be in discontinuous contact with the first region.

The electrode may be a light-transmittable dielectric electrode.

A discontinuous control film pattern with a plurality of openings may be formed on a part of the surface of the intrinsic region intended for the formation of the first region, the first region may be formed to a relatively shallow depth using the openings of the control film pattern, and the dielectric electrode may be in contact with the first region at the openings of the control film pattern.

The control film may be a silicon oxide film.

The light-receiving device may further comprise a separation layer, which is formed on the substrate to provide electrical insulation between the substrate and the intrinsic region.

The separation layer may be formed on the substrate by $O_2$ implantation.

The substrate may be a silicon-based substrate and the intrinsic region may be formed by regrowth of a silicon-based material.

The light-receiving device may have a structure with a plurality of light-receiving regions, each of which comprises the intrinsic region, the first region, and the second region, and an isolation region may be formed between the light-receiving regions for electrical insulation therebetween.

The isolation region may be formed of an insulation film and poly-silicon (poly-Si).

The light-receiving device may be used in at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

According to another aspect of the present invention, there is provided an optoelectronic integrated circuit comprising at least one light-receiving device for receiving light formed on a substrate, wherein the light-receiving device comprises an intrinsic region formed on the substrate; a first region formed to a relatively shallow depth in the intrinsic region; and a second region formed to a relatively deep depth in the intrinsic region and distanced from the first region, the first and second regions being doped with different conductivity types.

The optoelectronic integrated circuit may be used as at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

According to yet another embodiment of the present invention, there is provided a method for manufacturing a light-receiving device, the method comprising: preparing a substrate; forming an intrinsic region on the substrate; and forming first and second regions in the intrinsic region to relatively shallow and deep depths, respectively, wherein the first and second regions are distanced from each other and doped with different conductivity types.

According to specific embodiments of the present invention, the first region may be doped with p+ type. The method may further comprise forming on the first region an electrode patterned in such a way as to be in discontinuous contact with the first region.

The method may further comprise forming a discontinuous silicon control film pattern with a plurality of openings on a part of the surface of the intrinsic region intended for the formation of the first region. The first region may be formed to a relatively shallow depth using the openings of the control film pattern.

The method may further comprise forming a dielectric electrode in such a way as to be in contact with the first region at the openings of the control film pattern.

The method may further comprise forming a separation layer on the substrate to provide electrical insulation between the substrate and the intrinsic region before the formation of the intrinsic region.

When the light-receiving device comprise a one- or two-dimensional array of a plurality of light-receiving regions, each of which has the intrinsic region and first and second regions, the method may further comprise forming an isolation region between the light-receiving regions for electrical insulation of the light-receiving regions.

BRIEF DESCRIPTION OF THE DRAWINGS

The above and other features and advantages of the present invention will become more apparent by describing in detail exemplary embodiments thereof with reference to the attached drawings in which:

FIGS. 5 through 13 are views illustrating a fabrication process for a light-receiving device according to an embodiment of the present invention;

DETAILED DESCRIPTION OF THE INVENTION

Figure 2:
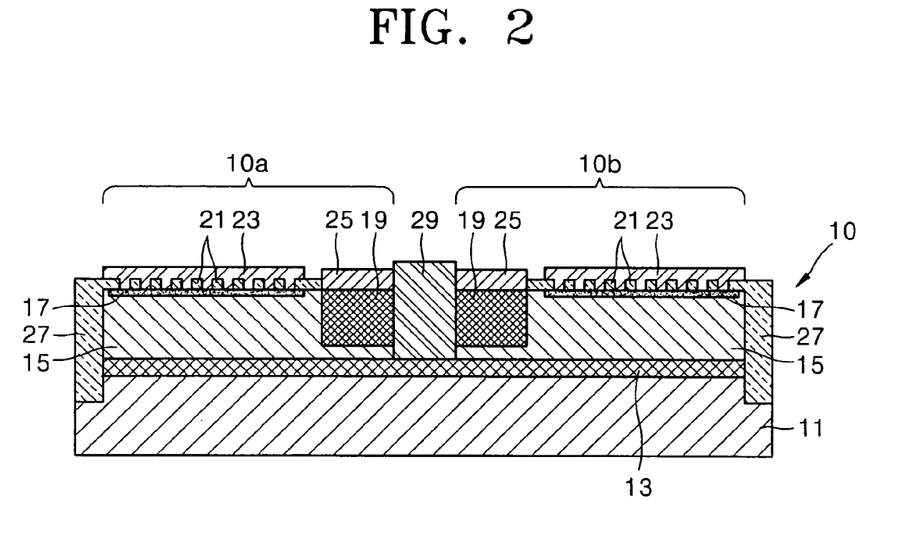
FIG. 2 is a sectional view of a light-receiving device according to an embodiment of the present invention.
Figure 3:
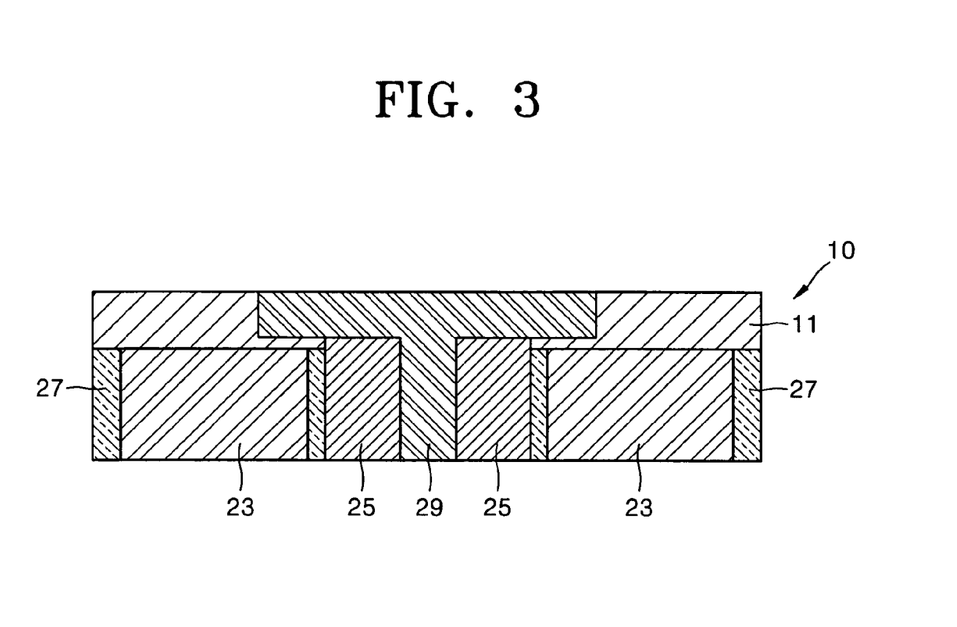
FIG. 3 is a plan view of the light-receiving device shown in FIG. 2.
Figure 4:
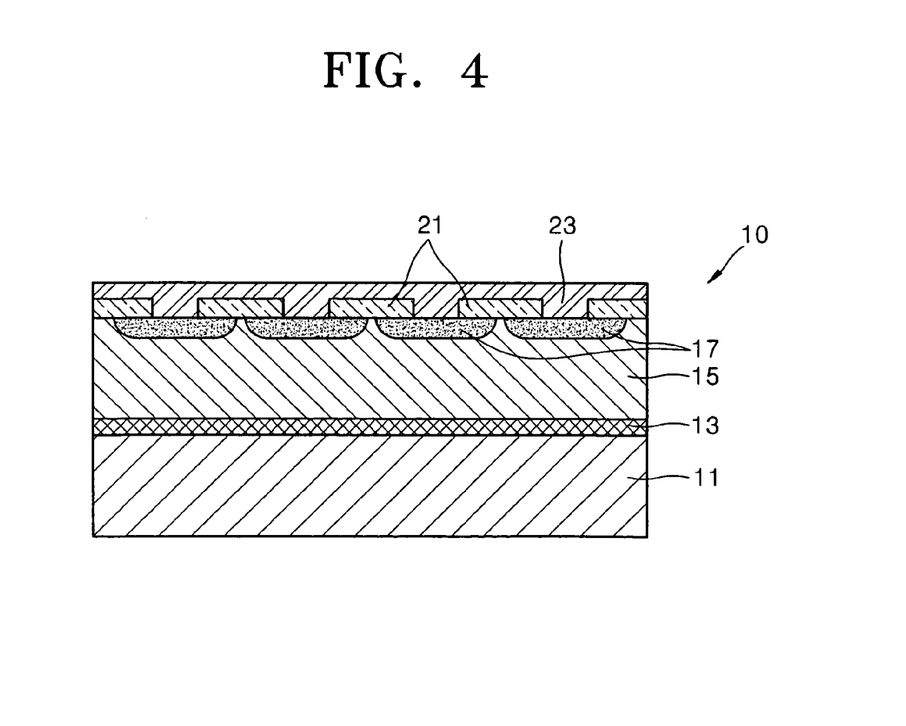
FIG. 4 is an enlarged view of the main part of FIG. 2.

FIG. 2 is a sectional view of a light-receiving device according to an embodiment of the present invention, FIG. 3 is a plan view of the light-receiving device shown in FIG. 2, and FIG. 4 is an enlarged view of the main part of FIG. 2.

Referring to FIGS. 2 through 4, the light-receiving device 10 according to the present invention comprises a substrate 11, an intrinsic region 15 formed on the substrate 11, a first region 17 formed to a relatively shallow depth in the intrinsic region 15, and a second region 19 formed to a relatively deep depth in the intrinsic region 15 and distanced from the first region 17. Preferably, the light-receiving device 10 further comprises a separation layer 13, which is formed on the substrate 11 for electrical insulation.

Preferably, the substrate 11 is a silicon-based substrate. For example, a p-type or n-type silicon substrate may be used as the substrate 11.

The separation layer 13 serves to provide the electrical insulation between the substrate 11 and the intrinsic region 15. Preferably, the separation layer 13 is formed on the surface of the substrate 11 by $O_2$ implantation.

In the case of forming the separation layer 13 by $O_2$ implantation, the substrate 11, for example, a p-type silicon substrate maintains an undamaged crystal structure, that is, an undamaged lattice structure. Therefore, the intrinsic region 15 can be formed by regrowth of a material with a lattice structure equal or similar to a material for the substrate 11.

As described above, after the separation layer 13 is formed to thereby electrically insulate between the substrate 11 and the intrinsic region 15, remaining constitutional elements for the light-receiving device 10 are formed on the separation layer 13. In this case, because electrical characteristics are not required for the substrate 11, there are no particular limitations to a doping concentration and a doping type of the substrate 11.

Therefore, in a case where the separation layer 13 is formed on the substrate 11, a wafer for a general silicon optical bench (SiOB), for example, a Si bare wafer can be used as the substrate 11. It is understood that a silicon wafer for integrated circuit (IC) formation can be used as the substrate 11.

In the case of forming an optoelectronic integrated circuit comprising the light-receiving device 10 on a silicon wafer for a silicon optical bench or a general integrated circuit, $O_2$ implantation for formation of the separation layer 13 may be applied to only the wafer portions intended for formation of the light-receiving device 10.

Therefore, the separation layer 13 allows the direct formation of the light-receiving device 10 on the above-described wafer.

In addition, the separation layer 13 provides electrical insulation when the light-receiving device 10 has a plurality of light-receiving regions with an n-division structure (n is an integer of 2 or more) or the light-receiving device 10 is formed in an array.

As a result of the formation of the separation layer 13, the light-receiving device 10 can be formed in a structure having a plurality of light-receiving regions. Also, when the light-receiving device 10 is in plurality, it can be formed in a one- or two-dimensional array.

Preferably, the intrinsic region 15 is formed on the separation layer 13 by regrowth of a silicon-based material. The intrinsic region 15 may be formed of a material equal or similar to the material for the substrate 11, for example Si, SiC, or diamond, to ensure lattice match of it with the substrate 11.

The thickness of the intrinsic region 15 varies depending on the detection wavelength of the light-receiving device 10. While a relatively thin intrinsic region 15 is required for detection of a blue light wavelength by the light-receiving device 10, a relatively thick intrinsic region 15 is required for detection of a longer wavelength light.

Considering the diffusion time of holes outside the intrinsic region 15 and increase of lattice mismatch by overgrowth, it is preferable to form the intrinsic region 15 to have an appropriate thickness.

For example, in the case of the light-receiving device 10 for detection of a blue light wavelength, the intrinsic region 15 may be formed to a thickness of about 1 $\mu$m using silicon. Since the absorption coefficient of light with a 400 nm wavelength in silicon is in the range of about $10^5$ to $10^6$ cm$^{-1}$, sufficient light absorption of 95% or more may be obtained even though the thickness of a depletion layer, that is, the intrinsic region 15 is about 1 $\mu$m.

Because the thickness of the intrinsic region 15 varies depending on the detection wavelength, it is suitable to use a partial SIMOX (separation by implantation of oxygen) process that forms the separation layer 13 only on the portions of the substrate 11 intended for the formation of the light-receiving device 10.

The first region 17 is a p+ doping region that is formed to a shallow depth by incorporating a predetermined dopant such as boron (B), aluminum (Al), or gallium (Ga) into the intrinsic region 15. Preferably, the first region 17 is doped with p+ type by a shallow diffusion process, more preferably, an ultra-shallow diffusion process. Here, a doping region formed by an ultra-shallow diffusion process is more shallowly doped when compared to a shallow diffusion process, but there is no particular limit between the two processes. Therefore, hereinafter, even an ultra-shallow diffusion process will be referred to as a shallow diffusion process, and thus, a shallow diffusion process comprehends the meaning of an ultra-shallow diffusion process.

Preferably, the first region 17 is formed to a shallow depth, for example, a depth of about 50 nm to shorten the transit distance of holes.

As will be described later, a control film 21 pattern having a plurality of openings is formed on portions of the intrinsic region 15 intended for the formation of the first region 17 using a silicon oxide. The first region 17 may be formed to a shallow depth by a diffusion process through the openings of the control film 21 pattern.

Doping for a shallow depth of about 50 nm can also be accomplished by an implantation process. Therefore, the first region 17 may be formed by an implantation process.

The second region 19 is an n-type, preferably, an n+ doping region that is distanced from the first region 17 and is formed to a relatively deep depth in the intrinsic region 15. Preferably, the second region 19 is formed by a deep diffusion process. Because the second region 19 is formed to a deep depth, it may be formed by a general diffusion process.

As mentioned above, the light-receiving device 10 has a planar arrangement structure of the first and second regions 17 and 19 in the intrinsic region 15.

Meanwhile, the light-receiving device 10 further comprises first and second electrodes 23 and 25 on the first and second regions 17 and 19 to apply a reverse bias voltage between the first and second regions 17 and 19 and to output a detection signal.

Preferably, the first electrode 23 is a transparent, light-transmittable dielectric film, for example an ITO or ZnO dielectric electrode. The second electrode 25 may be made of a typical metal such as aluminum (Al).

Preferably, the first electrode 23 is patterned in such a way as to be in discontinuous contact with the first region 17.

The formation of the first electrode 23 on the first region 17 can break the characteristics of junctions, for example, ultra-shallow junctions. However, the characteristics of junctions at the portions of the first region 17 that are not in contact with the first electrode 23 are not broken.

Such a discontinuous contact patterning of the first electrode 23 on the first region 17 allows the formation of the first electrode 23 by a regular process, and thus, the light-receiving device 10 has excellent mass production capability.

In addition, in the case of using a transparent dielectric electrode as the first electrode 23, the light-receiving device 10 may be formed in such a structure that the control film 21 pattern is left on the first region 17. Therefore, the light-receiving device 10 has optical wavelength selectivity due to the patterned structure of the control film 21.

FIGS. 2 through 4 show an example of the light-receiving device 10 having such a structure that the patterned control film 21 and the first electrode 23 are alternately in contact with the first region 17.

The control film 21 can be patterned in such a manner that a silicon oxide film (for example) is formed on the surface portions of the intrinsic region 15 intended for the formation of the first region 17 and then the silicon oxide film is etched by a photolithography process to form a plurality of openings for a diffusion process. In view of one light-receiving region, the openings are in a one- or two-dimensional arrangement and the control film 21 so patterned has a mask structure due to the openings. Here, the control film 21 pattern is formed by the combination of dry and wet processes.

The first region 17 is formed by injecting dopants such as boron and phosphorus into the openings of the control film 21 pattern by a shallow diffusion process or an implantation process. As mentioned above, it is preferable to form the first region 17 using a shallow diffusion process. The first region 17 may also be formed by an implantation process.

Preferably, the control film 21 is a silicon oxide ($SiO_2$) film.

The control film 21 pattern made of silicon oxide serves as an interstitial supplying source so that the first region 17 is formed to a shallow depth by diffusion process. Also, the control film 21 pattern serves to control the diffusion depth by adjustment of the vacancy defect by a halogen gas, such as a chlorine gas, used as an external process condition, and to reduce tunneling by a reverse bias.

Preferably, the silicon oxide film pattern is formed in an appropriate thickness to be obtained desired shallow diffusion.

As well known in the field of the diffusion technology, when a silicon oxide film thicker than an appropriate thickness (e.g. several thousand Angstroms) or a diffusion temperature is low, vacancies mainly affect diffusion, thereby causing a deep diffusion. On the other hand, when a silicon oxide film is thinner than an appropriate thickness or a diffusion temperature is high, Si self-interstitials mainly affect diffusion, thereby causing a deep diffusion.

Therefore, if a silicon oxide film is formed to an appropriate thickness in which the Si self-interstitials and the vacancies are generated at a similar ratio, combination of the Si self-interstitials and vacancies retards dopant diffusion. As a result, desired shallow doping is accomplished. The physical properties of the vacancies and self-interstitials as used herein are well disclosed in the field of the diffusion technology, and thus, the detailed descriptions thereof will be omitted.

As mentioned above, the silicon oxide control film 21 serves as an interstitial supplying source and adjusts the vacancy defect, and thus allow the formation of the first region 17 to a shallow depth by a diffusion process.

In case of the formation of the control film 21 pattern and the first region 17 as described above, the first region 17 can be formed in various one- or two-dimensional arrays depending on the shapes and arrangements of the openings of the control film 21 pattern. The whole portions of the first region 17 serve as a light-receiving region for the light-receiving device 10.

FIG. 4 shows a plurality of doping regions for the first region 17 discontinuously positioned in one light-receiving region. Such discontinuity of the first region 17 varies depending on the widths of the portions of the control film 21 pattern that are positioned between the openings.

In detail, upon diffusion of a dopant through the openings of the control film 21 pattern, the doping regions are also formed under the control film 21 by side diffusion. Therefore, in the case of decreasing the widths of the portions of the control film 21 pattern positioned between the openings to a sufficient level, the doping regions for the first region 17 formed at the positions corresponding to each of the openings may be connected to each other.

The widths of the portions of the control film 21 pattern and the discontinuity of the first region 17 are optional matters, and thus, various changes thereof can be made.

Because the control film 21 is patterned in such a way as to have a plurality of openings and the first region 17 is formed through the openings of the control film 21 pattern, the first region 17 can be formed to a large size. Therefore, the area of the light-receiving region can be changed as needed.

In addition, upon diffusion of a dopant through the openings of the control film 21 pattern, diffusion regions are also formed under the control film 21. For this reason, when the first electrode 23 is in contact with the first region 17 at the openings of the control film 21 pattern, although the ultra-shallow junctions at the openings are broken, the ultra-shallow junctions at the diffusion regions formed under the control film 21 are not broken. Therefore, the first electrode 23 can also be formed by a regular process, and thus, the light-receiving device 10 has excellent mass production capability.

As shown in FIGS. 2 and 4, in a case where the light-receiving device 10 has the first electrode 23 made of a transparent dielectric material and has such a structure that the first electrode 23 and the control film 21 are alternately in contact with the first region 17, the periodic pattern of the control film 21 can increase wavelength selectivity to light of a specific wavelength range. Therefore, the light-receiving device 10 may receive only light of a specific wavelength range.

As mentioned above, the control film 21 pattern serves as an interstitial supplying source for shallow diffusion and as an optical film.

In addition, the control film 21 pattern serves to reduce breakage of junctions.

In detail, when the control film 21 pattern and the first dielectric electrode 23 have a multi-structure, the first electrode 23 made of a dielectric material has a sheet resistance, and thus, serves as an electrode for spreading an electric current. When an electric current reaches the control film 21, i.e., the silicon oxide film, the multi-structure serves as a parallel plate capacitor inserted an N electrode, i.e., the second electrode 25 and a material with a high dielectric constant, with a dielectric material as the center thereof.

Thus, because the light-receiving device 10 has such a multi-structure that the first electrode 23 and the control film 21 are alternately in contact with the first region 17, unlike such a conventional structure that an electrode is directly formed on a silicon substrate, a capacitance increases and a tunneling dark current due to a strong reverse bias in ultra-shallow junctions decreases, thereby preventing breakage of junctions. In addition, the multi-structure serves to increase a voltage-capacitance resistance even if a high electric field is applied thereto.

For example, an electric field applied to the structure having the silicon oxide film and the dielectric electrode is less than that applied to the structure having only the dielectric electrode. Because the first region 17, i.e., the shallow P junction is highly doped, the structure having only the dielectric electrode can easily experience tunneling, i.e., a dark current due to a reverse bias voltage, as well as experiencing electromigration. In an aluminum electrode, a distinct spark is generated.

But, because the structure having the silicon oxide film and the dielectric electrode is subjected to the decreased electric field relative to the structure having only the dielectric electrode, a tunneling by a reverse bias voltage is prevented by the silicon oxide film. In addition, due to existing of the silicon oxide film, some electrostatic charges can be accumulated, and thus, uniformity of total electric field distribution can be adjusted.

FIGS. 2 and 4 show an example of the light-receiving device 10 having such a structure that the first electrode 23 made of a light-transmittable dielectric material and the control film 21 are alternately in contact with the first region 17. The light-receiving device 10 may also be manufactured in such a structure that the control film 21 is removed. In this case, the first electrode 23 is formed in such a way as to be in discontinuous contact with the first region 17 and then the patterns of the first electrode 23 are connected to each other at the outside of the light-receiving region of the light-receiving device according to the present invention.

Preferably, the light-receiving device 10 comprises a silicon oxide film 27 for covering the intrinsic region 15 at a region other than the effective light-receiving region. By forming the silicon oxide film 27, the exposure of the intrinsic region 15 is prevented, and thus, occurrence of a dark current can be suppressed. The silicon oxide film 27 for suppressing a dark current may be formed simultaneously with the formation of the control film 21. Alternatively, the silicon oxide film 27 may be formed using a separate process.

Meanwhile, the light-receiving device 10 may have a plurality of light-receiving regions (10a and 10b, as shown in FIGS. 2 and 3). In this case, it is preferable to form an isolation region 29 for insulating the light-receiving regions 10a and 10b.

The isolation region 29 is formed in such a way as to be in contact with the separation layer 13. The isolation region 29 may be formed of an insulation film and poly-silicon (poly-Si). The isolation region 29 may be formed in such a manner that a silicon oxide film, i.e., an insulation film is formed in a trench and then the space of the trench is filled with poly-silicon, as will be described later with reference to FIGS. 8A and 8B.

The light-receiving device 10 shown in FIGS. 2 and 3 has two light-receiving regions 10a and 10b. However, this is provided only for illustration, and thus, the present invention may have three or more light-receiving regions or a single light-receiving region.

According to the light-receiving device 10 as described above, when light is incident in a state where a positive voltage is applied to the second electrode 25 on the second region 19, i.e., an aluminum electrode on an N layer, and a negative voltage is applied to the first electrode 23 on the first region 17, i.e., a dielectric electrode on a P layer, the incidence light is absorbed in the intrinsic region 15 and generates electron-hole pairs. In this state, by a reverse bias voltage applied, the generated electrons accelerate toward the second electrode 25 as a positive electrode, the generated holes accelerate toward the first electrode 23 as a negative electrode, and then the electrons and holes are eliminated.

In the light-receiving device 10 of the present invention, the first and second regions 17 and 19 are doped with different conductivity types and arranged in a plane structure. The first and second electrodes 23 and 25 are formed on the first and second regions 17 and 19, respectively. Therefore, the light-receiving device 10 has such a structure that opposite electrodes are positioned on the same surface level as that at which the shallow doping region is positioned, and electrons and holes are diagonally eliminated.

In the light-receiving device 10 of the present invention, due to the thin thickness of the first region 17 doped with p-conductivity type, when a reverse bias voltage is applied to the first and second electrodes 23 and 25, a horizontal electric field is mainly generated. Under such a horizontal electric field, holes travel at a short distance to the first electrode 23 due to a thin thickness of the first region 17 while electrons travel at a relatively long distance to the second electrode 25 formed on the second region 19 doped with a deep diffusion depth. Therefore, a response delay by a mobility difference between holes and electrons is decreased, thereby accomplishing a high response speed.

In addition, the thickness of the first region 17, i.e., p layer, in the light-receiving device 10 is thinner than that in a conventional light-receiving device, and thus, most light may be absorbed in the intrinsic region 15. Also, the intrinsic region 15 is completely electrically isolated from the outside by the silicon oxide film, and thus, a dark current due to a surface recombination in sides is decreased. Therefore, a dark current is insignificant.

Furthermore, when the first electrode 23 is formed on the first region 17, there is no need to consider breakage of ultra-shallow junctions. Therefore, there are no particular limitations to the fabrication condition of the first electrode 23.

Still furthermore, the light-receiving device 10 has such a structure that the first electrode 23 and the control film 21 are alternately in contact with the first region 17. Therefore, the light-receiving device 10 has wavelength selectivity and excess concentration of a reverse bias can be relieved.

The fabrication method of the light-receiving device 10 having a plurality of light-receiving regions 10a and 10b according to the present invention will now be described with reference to FIGS. 2 through 4.

Figure 5:
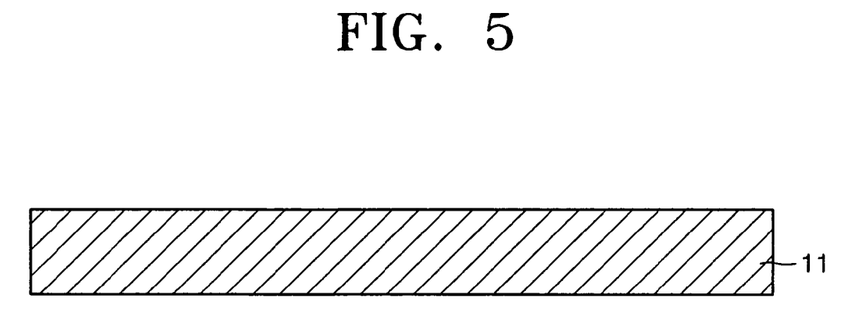

Referring to FIG. 5, first, a silicon-based substrate 11, for example, an n- or p-type silicon substrate is prepared. A wafer for a typical optical bench may be used as the substrate 11. Alternatively, a silicon wafer for the formation of a general integrated circuit may be used as the substrate 11.

Figure 6:
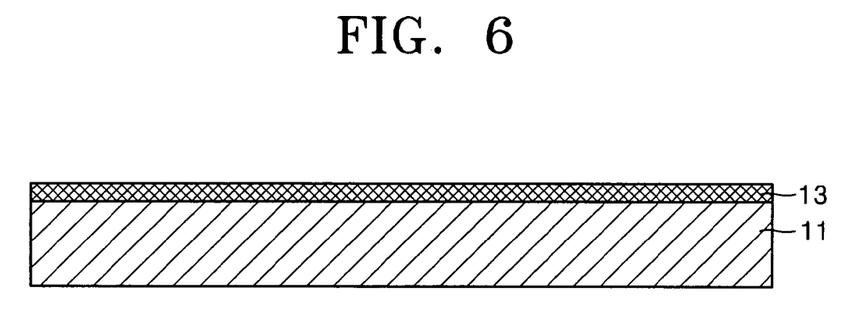

Next, a separation layer 13 is formed only on the surface portions of the silicon substrate 11 intended for the formation of the light-receiving device 10 using an $O_2$ implantation process to thereby provide area separation, as shown in FIG. 6. The formation of the separation layer 13 is required when the substrate 11 is used as the base for an optoelectronic integrated circuit comprising the light-receiving device 10 or the light-receiving device 10 has several division segments. It is understood that the formation of the separation layer 13 can be omitted when the light-receiving device 10 has a single light-receiving region.

Figure 7:
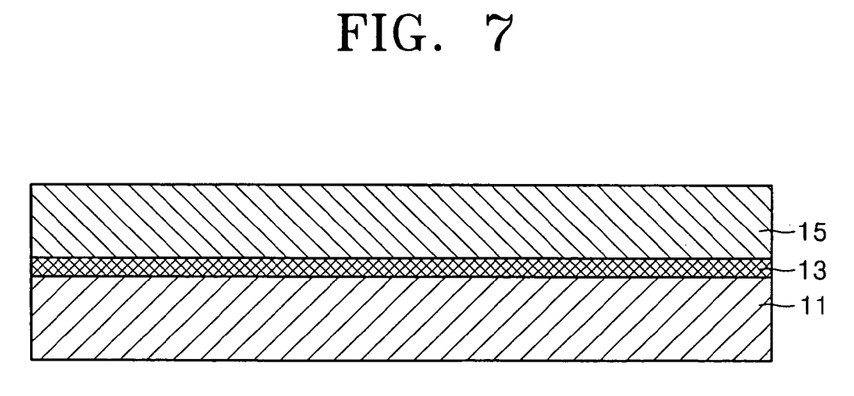

Next, the intrinsic region 15 is formed by regrowth of a silicon-based material equal or similar to the material for the substrate 11, for example silicon, as shown in FIG. 7. In this case, the intrinsic region 15 is formed to an appropriate thickness in view of the wavelength of light to be received and occurrence of a lattice mismatch.

Figure 8A:
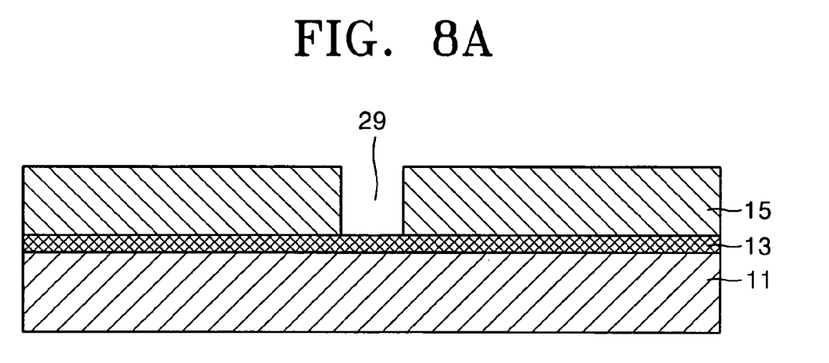
Figure 8B:
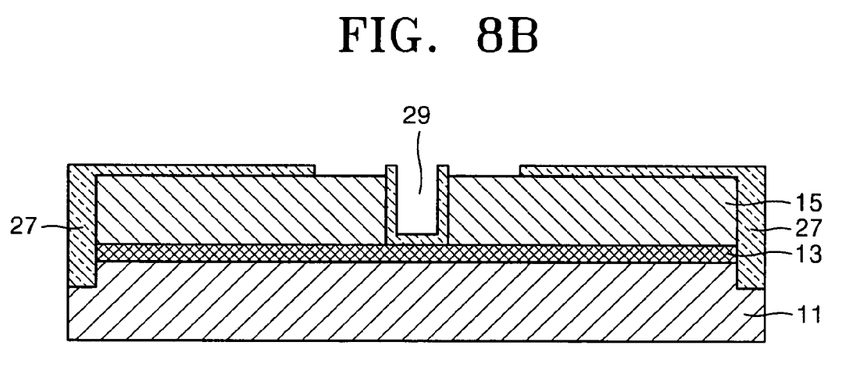

Next, a trench 29' is formed in a portion of the intrinsic region 15 intended for the formation of the isolation region 29, as shown in FIG. 8A. Then, the silicon oxide film 27 is formed to cover the intrinsic region 15 including the upper surface of the intrinsic region 15 intended for the formation of the light-receiving regions 10a and 10b, as shown in FIG. 8B. Preferably, the silicon oxide film 29 is formed using a dry oxidation process. The silicon oxide film 27 is not formed on the positions intended for the formation of the second region 19.

Figure 9:
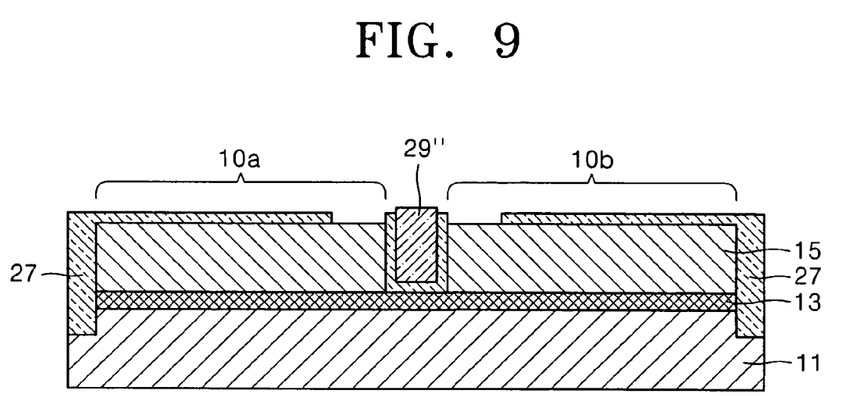

Next, the space of the trench 29' formed the silicon oxide film 27 is filled with poly-silicon to form the isolation region 29 to electrically insulate between the light-receiving regions 10a and 10b, as shown in FIG. 9. The isolation region 29 is formed in such a way as to be in contact with the separation layer 13. Consequently, the isolation region 29 is formed of a silicon oxide insulation film and poly-silicon.

Figure 10:
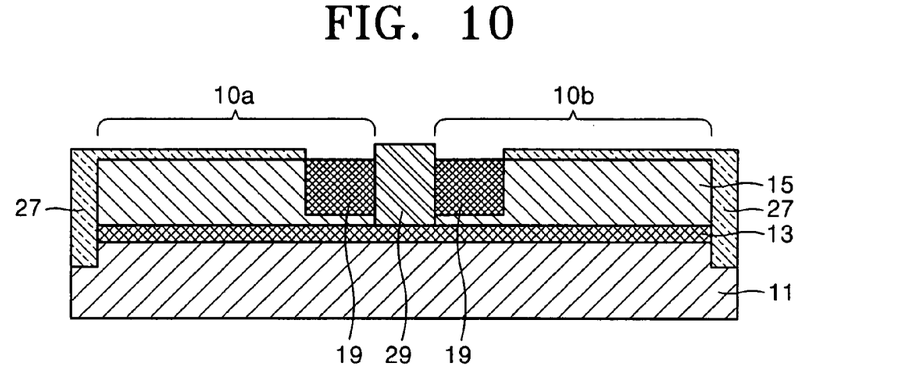

Next, the second region 19 is formed using a general N-type diffusion process, as shown in FIG. 10. Preferably, the second region 19 is formed to a deep depth and doped with n+ type.

Figure 11:
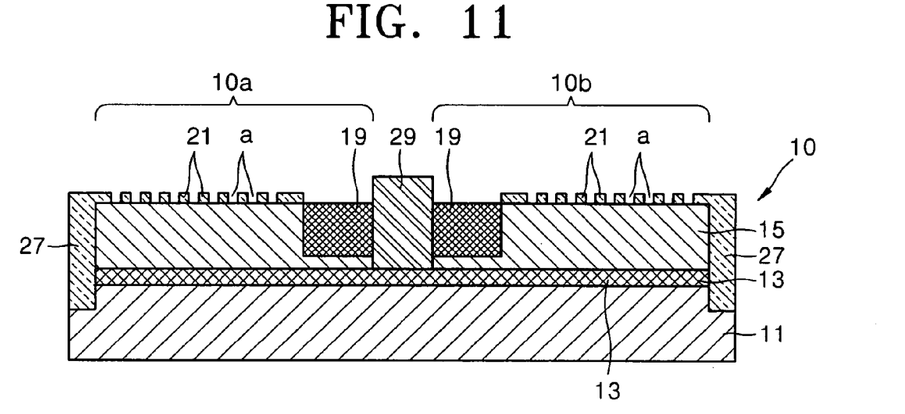

Next, a plurality of openings (a) are formed in the portions of the control film 21 intended for the formation of the light-receiving regions 10a and 10b using a holography process to thereby form the control film 21 pattern, as shown in FIG. 11.

Figure 12:
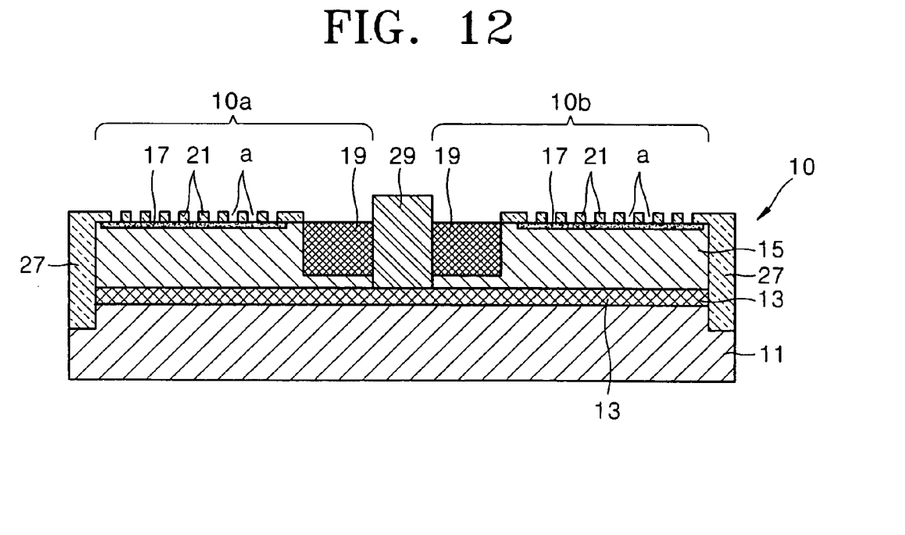

Next, boron (for example) is diffused through the openings of the control film 21 pattern to form the first region 17 that is doped with p+ type and formed to a shallow depth, as shown in FIG. 12. In this case, when the control film 21 is a silicon oxide film, a shallow diffusion process, preferably an ultra-shallow diffusion process is carried out, and thus, the first region 17 is formed to a shallow depth.

Because the control film 21 pattern has a plurality of openings in one light-receiving region, one light-receiving region has a plurality of doping regions for the first region 17. Therefore, the number of the doping regions of the first region 17 varies depending on a desired area of the light-receiving region. The doping regions of the first region 17 may be connected to each other by adjustment of the width of the portions of the control film 21, which are positioned between the openings.

Figure 13:
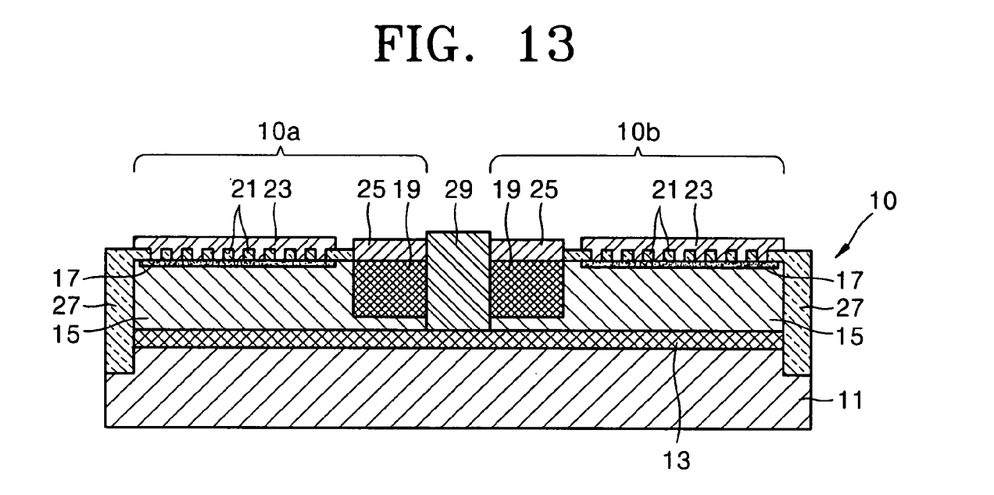

Next, the first electrode 23 is formed using a dielectric material in such a way as to be in contact with the first region 17 at the openings of the control film 21 pattern and the second electrode 25 is formed on the second region 19 using a metal such as aluminum, as shown in FIG. 13. The control film 10 pattern serves as a mask for the formation of the first electrode 23. The first electrode 23 is made of a light-transmittable dielectric material.

As mentioned above, the first electrode 23 may be formed using a normal process, and thus, the light-receiving device 10 has excellent mass production capability.

As shown in FIG. 13, when the light-receiving device 10 is formed, in such a multi-structure that the control film 21 and the first electrode 23 are alternately in contact with the first region 17, the control film 21 pattern serves as an optical film. Therefore, the light-receiving device 10 has wavelength selectivity for receiving a specific wavelength range. That is, in order for the light-receiving device 10 to receive only light of a specific wavelength, the control film 21 may be formed in such a way as to have a periodic pattern corresponding to such a specific wavelength and the intrinsic region 15 may be formed in such a way as to have a thickness sufficient to absorb the light of such a specific wavelength. Therefore, the periodic pattern of the control film 21 and the thickness of the intrinsic region 15 can be selected case by case.

The control film 21 pattern may be removed after the formation of the first electrode 23. In this case, the pattern portions of the first electrode 23, which are in contact with the doping regions of the first region 17, are connected to each other at the outside the light-receiving regions 10a and 10b.

The fabrication process of the light-receiving device 10 as described above is only for illustration, and thus, various changes thereof may be made therein without departing from the spirit and scope of the present invention.

The substrate 11 for the light-receiving device 10 as described above may be used as a base for at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with at least one light-receiving device.

An optoelectronic integrated circuit comprising the light-receiving device 10 of the present invention may be at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

Figure 14A:
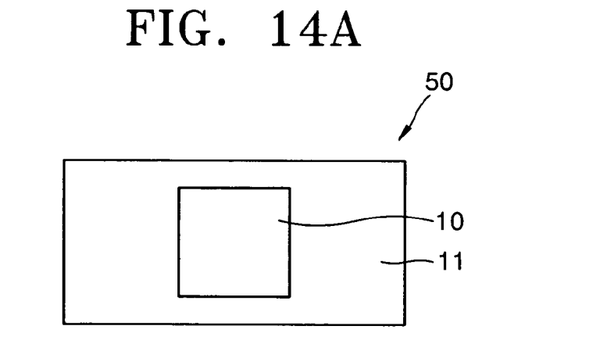
FIG. 14A is a schematic view of an example of a light-receiving device for optical communication with a light-receiving device according to the present invention.
Figure 14B:
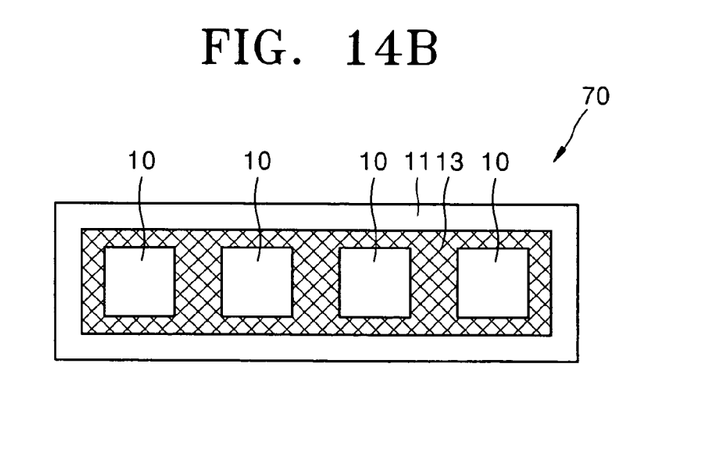
FIG. 14B is a schematic view of another example of a light-receiving device for optical communication with a light-receiving device according to the present invention.

Referring to FIGS. 14A and 14B, light-receiving devices 50 and 70 for optical communication may have one or more of the light-receiving device 10 of the present invention to receive an optical signal. In the case of the light-receiving device 70 having a plurality of the light-receiving devices 10 as shown in FIG. 14B, a plurality of the light-receiving devices 10 are positioned on a single substrate 11 in an array. Although FIG. 14B shows a one-dimensional array of the light-receiving devices 10 on the substrate 11, the number and arrangement of the light-receiving devices 10 can vary depending on the purpose used. In this case, the separation layer 13 is positioned between the substrate 11 and the intrinsic region 15 of each of the light-receiving devices 10 to provide electrical insulation therebetween. The light-receiving devices 10 are distanced from each other or have the isolation regions 29 therebetween. FIG. 14B shows an example of the light-receiving device 70, in which the separation layer 13 is formed on the surface position of the substrate 11 intended for the formation of a plurality of the light-receiving devices 10 and the light-receiving devices 10 are distanced from each other.

The light-receiving device 50 for optical communication as shown in FIG. 14A may also be used as an optoelectronic integrated circuit with a single light-receiving device for other purposes. The light-receiving device 70 for optical communication as shown in FIG. 14B may also be used as an optoelectronic integrated circuit with a one- or two-dimensional array of a plurality of light-receiving devices for other purposes.

A light-receiving device for optical pick-up is fabricated such that the light-receiving device 10 of the present invention has a plurality of light-receiving regions as shown in FIG. 1. A light-receiving device for optical pick-up is used to reproduce information recorded at an optical disc and/or detect an error signal for servo system.

An optical module as an example of an optoelectronic integrated device of the present invention has a single package of a semiconductor laser as a light source and the light-receiving device 10 of the present invention. An optical module for optical communication serves to transmit and receive an optical signal. An optical module for optical pick-up serves to irradiate light on an optical disc and receive light reflected from the optical disc.

Optical modules for optical communication and optical pick-up can be formed in the form of a silicon optical bench (SiOB) using the substrate 11 of the light-receiving device 10 as a base.

Figure 15:
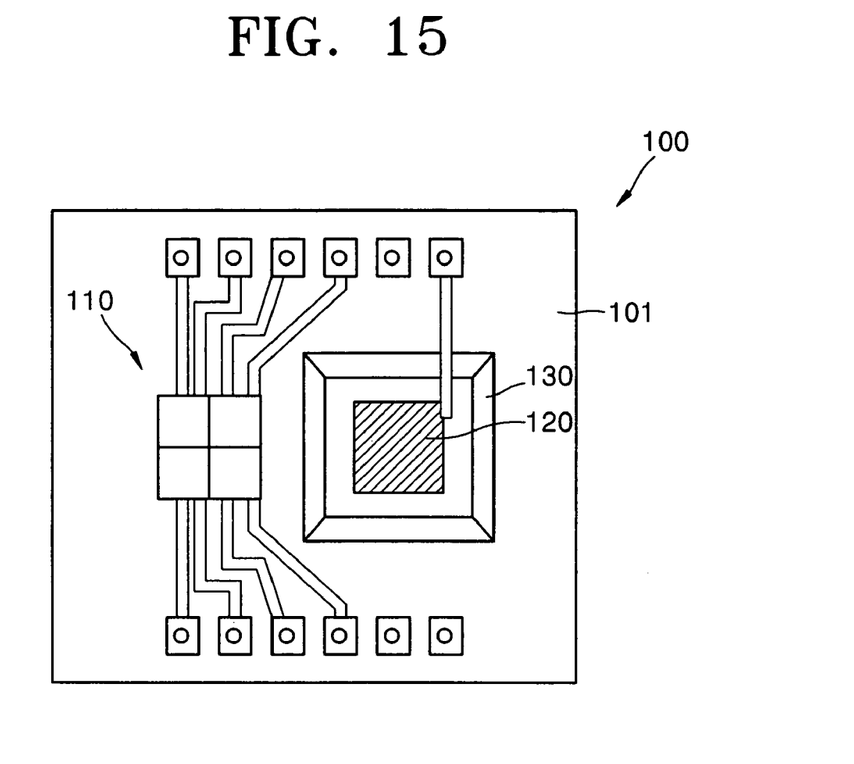
FIG. 15 is a view of an example of an optical bench with a light-receiving device according to the present invention.
Figure 16:
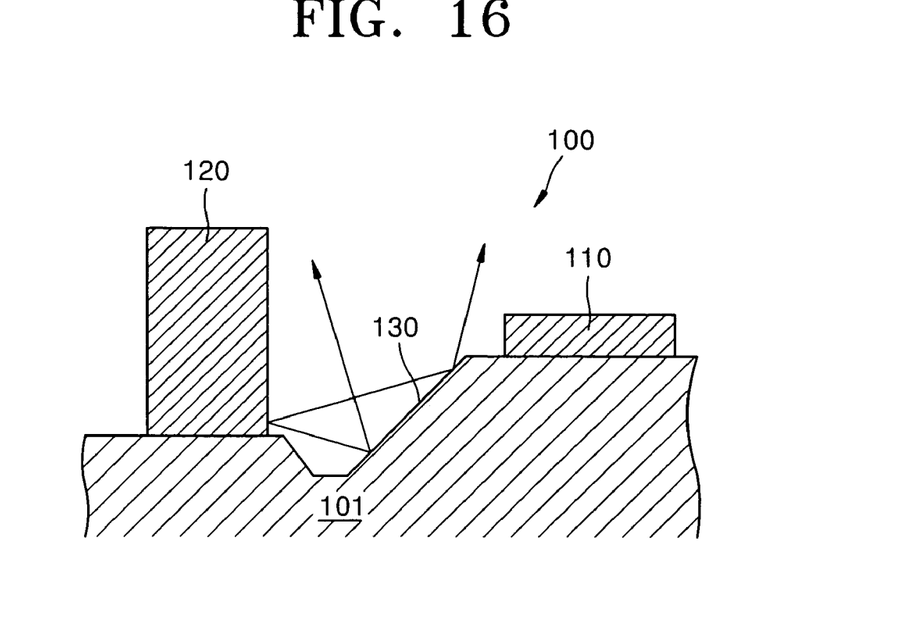
FIG. 16 is a schematic sectional view of the optical bench of FIG. 15.

FIG. 15 shows an example of an optical bench 100. A 4-division light-receiving device 110 has a 2×2 array of four light-receiving regions. In the case of using an edge-emitting laser diode as the semiconductor laser 120 as shown in FIG. 16, it is preferable to cut the base 101 to have a reflective surface 130 inclined at an angle of about 45 degrees about installation site of the semiconductor laser 120. By doing so, a laser light output through the side of the laser diode advances in a vertical direction by reflection.

FIG. 15 shows the optical bench 100 as an optical module for optical pick-up with the 4-division light-receiving device 110. The optical bench 100 can also be used as an optical module for optical communication by forming the light-receiving device 100 with a single light-receiving region or, alternatively, positioning a plurality of the light-receiving devices in an array and then positioning the semiconductor lasers 120 in an array correspondingly to the light-receiving devices.

Figure 17:
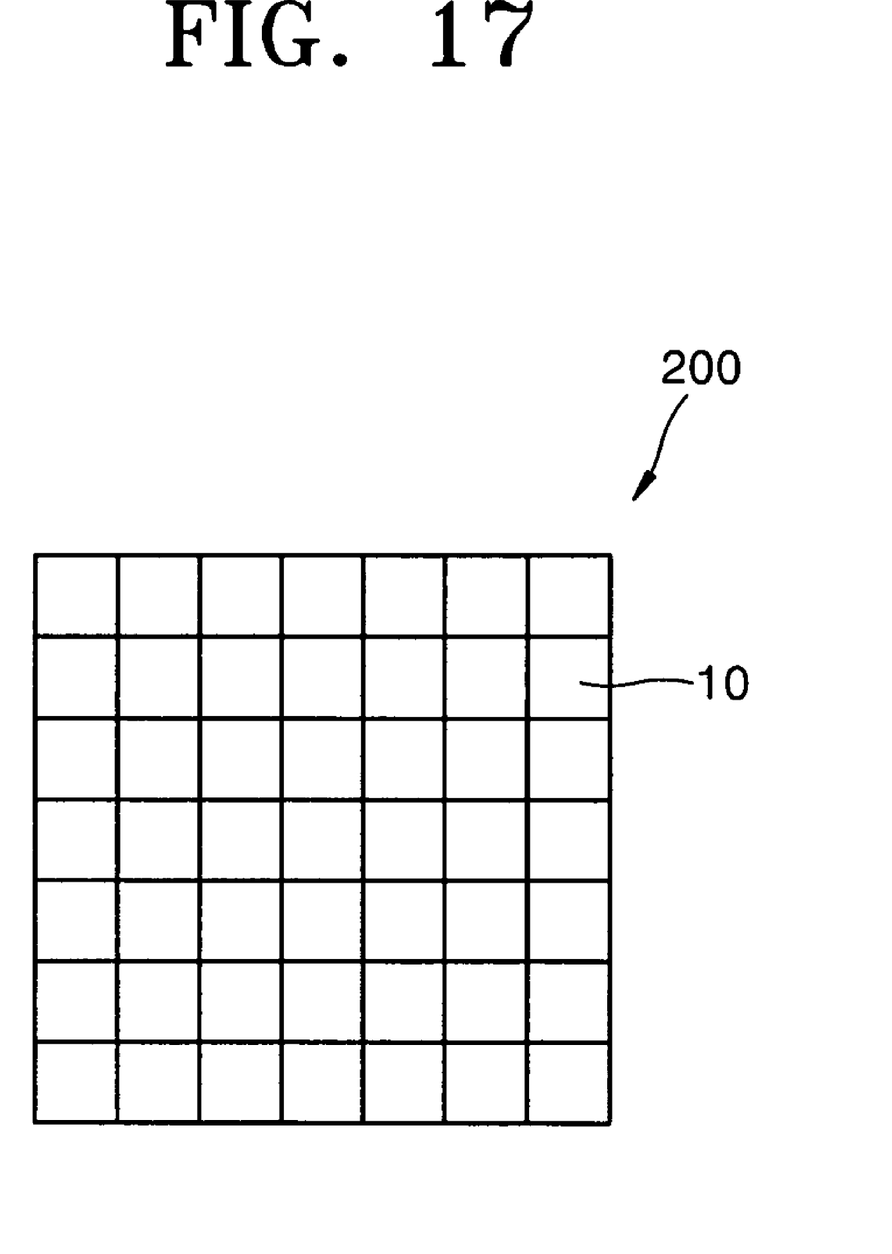
FIG. 17 is a schematic view of an example of an optoelectronic integrated circuit with a two-dimensional array structure of a light-receiving device according to the present invention.

FIG. 17 shows an optoelectronic integrated circuit 200 according to another embodiment of the present invention. Referring to FIG. 17, the optoelectronic integrated circuit 200 has a two-dimensional array of the light-receiving devices 10.

The optoelectronic integrated circuit 200 may be used as an image photographic device such as a solid image photographic device. Based on the fact that the light-receiving device 10 of the present invention has wavelength selectivity, for example, in a case where three of the light-receiving devices 10 are positioned for each pixel and selectively receive, for example, red light, green light, and blue light, respectively, the light-receiving devices 10 of the present invention can form the optoelectronic integrated circuit 200 capable of photographing a color image.

The optoelectronic integrated circuit 200 may also take a color image by attenuating the wavelength selectivity of the light-receiving device 10 in order for the light-receiving device 10 to receive visible light including red light, green light, and blue light, positioning the light-receiving device 10 in a two-dimensional array to thereby form the optoelectronic integrated circuit 200, and positioning a color filter at the front part of the optoelectronic integrated circuit 200.

The above-described optoelectronc integrated circuits comprising the light-receiving device 10 of the present invention are provided only for illustrations, and thus, various embodiments of the optoelectronic integrated circuits are possible.

As apparent from the above descriptions, in the light-receiving device of the present invention, holes with slow mobility has a short transfer distance, and thus, a response delay does not occur. As a result, a high response speed can be accomplished.

Because the silicon oxide film and the dielectric electrode are patterned in such a way as to be alternately in contact with the doping region used as a light-receiving region, a tunneling dark current by a strong reverse bias voltage can be prevented. Because the formation of the silicon oxide film prevents the exposure of the intrinsic region, a dark current by a surface recombination at sides can be reduced. As a result, the dark current is insignificant. Therefore, a noise is reduced, and thus, sensitivity characteristics are enhanced.

In the case of patterning the silicon oxide film and the dielectric electrode in such a way as to be alternately in contact with the doping region used as a light-receiving region, the silicon oxide film pattern serves as an optical film. As a result, the light-receiving device of the present invention has wavelength selectivity to receive light of a specific wavelength range.

Because the separation layer is formed only on a portion intended for the formation of the light-receiving device to electrically isolate the substrate and the intrinsic region, there are no particular limitations to the doping concentration and characteristics of the substrate. Therefore, the substrate of the light-receiving device of the present invention can be used as a base for at least one selected from a light-receiving device for optical communication, a light-receiving device for optical pick-up, an optical module for optical communication with an integral structure of a semiconductor laser and a light-receiving device, an optical module for an optical pick-up, various optical benches with light-receiving devices, and various optoelectronic integrated circuits with a single light-receiving device or a one- or two-dimensional array of a plurality of light-receiving devices. Consequently, various optoelectronic integrated devices comprising the light-receiving device of the present invention can be obtained.

In addition, the light-receiving device of the present invention can satisfy the requirements such as a high response speed and a low noise. Therefore, the light-receiving device of the present invention can be manufactured to an integral structure of it with various devices requiring a high integrity, for example a photodetector integrated circuit (PDIC).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light-receiving device comprising:
a substrate;
an intrinsic region formed on the substrate;
a first region formed to a relatively shallow depth in the intrinsic region; and
a second region formed to a relatively deep depth in the intrinsic region and distanced from the first region, wherein the first and second regions are doped with different conductivity types;
a discontinuous control film pattern with a plurality of openings located on the first region; and
an electrode in physical contact with the first region at a plurality of locations through the plurality of openings of the discontinuous control film,
wherein the first region is formed to the relatively shallow depth using the openings of the control film pattern.

2. The light-receiving device according to claim 1, wherein the first region is doped with p+ type.

3. The light-receiving device according to claim 1, further comprising a silicon oxide film for preventing the exposure of the intrinsic region.

4. The light-receiving device according to claim 1, wherein the first region is formed by one of a shallow diffusion process and/or implantation process and the second region is formed by a deep diffusion process.

5. The light-receiving device according to claim 1, further comprising a separation layer, which is formed on the substrate to provide electrical insulation between the substrate and the intrinsic region.

6. The light-receiving device according to claim 5, wherein the separation layer is formed on the substrate by $O_2$ implantation.

7. The light-receiving device according to claim 6, wherein the substrate is a silicon-based substrate and the intrinsic region is formed by regrowth of a silicon-based material.

8. The light-receiving device according to claim 5, wherein the substrate is a silicon-based substrate and the intrinsic region is formed by regrowth of a silicon-based material.

9. The light-receiving device according to claim 5, wherein the light-receiving device has a structure with a plurality of light-receiving regions, each of which comprises the intrinsic region, the first region, and the second region, and
an isolation region is formed between the light-receiving regions for electrical insulation therebetween.

10. The light-receiving device according to claim 1, wherein the substrate is a silicon-based substrate and the intrinsic region is formed by regrowth of a silicon-based material.

11. The light-receiving device according to claim 1, which is used in a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuit with a single light-receiving device or a one- or two-dimensional array of a plurality of light-receiving devices.

12. The light receiving device according to claim 1, wherein the first region has a depth of about 50 nm.

13. A light-receiving device comprising:
a substrate;
an intrinsic region formed on the substrate;
a first region formed to a relatively shallow depth in the intrinsic region; and
a second region formed to a relatively deep depth in the intrinsic region and distanced from the first region,
wherein the first and second regions are doped with different conductivity types,
wherein the first region is doped with p+ type and comprise thereon an electrode patterned in such a way as to be in discontinuous contact with the first region, and
wherein the electrode is a light-transmittable dielectric electrode.

14. The light-receiving device according to claim 13, wherein a discontinuous control film pattern with a plurality of openings is formed on a part of the surface of the intrinsic region intended for the formation of the first region, the first region is formed to a relatively shallow depth using the openings of the control film pattern, and the dielectric electrode is in contact with the first region at the openings of the control film pattern.

15. The light-receiving device according to claim 14, wherein the control film is a silicon oxide film.

16. A light-receiving device comprising:
a substrate;
an intrinsic region formed on the substrate;
a first region formed to a relatively shallow depth in the intrinsic region;
a second region formed to a relatively deep depth in the intrinsic region and distanced from the first region, wherein the first and second regions are doped with different conductivity types;
a separation layer, which is formed on the substrate to provide electrical insulation between the substrate and the intrinsic region,
wherein the light-receiving device has a structure with a plurality of light-receiving regions, each of which comprises the intrinsic region, the first region, and the second region, and
an isolation region is formed between the light-receiving regions for electrical insulation therebetween, wherein the isolation region is formed of an insulation film and poly-silicon (poly-Si).

17. An optoelectronic integrated circuit comprising at least one light-receiving device for receiving light formed on a substrate, wherein the
light-receiving device comprises:
an intrinsic region formed on the substrate;
a first region formed to a relatively shallow depth in the intrinsic region; and
a second region formed to a relatively deep depth in the intrinsic region and distanced from the first region, the first and second regions being doped with different conductivity types;
a discontinuous control film pattern with a plurality of openings located on the first region; and
an electrode in physical contact with the first region at a plurality of locations through the plurality of openings of the discontinuous control film, wherein the first region is formed to a relatively shallow depth using the openings of the control film pattern.

18. The optoelectronic integrated circuit according to claim 17, wherein the first region is doped with p+ type.

19. The optoelectronic integrated circuit according to claim 17, wherein the light-receiving device further comprises a silicon oxide film for preventing the exposure of the intrinsic region.

20. The optoelectronic integrated circuit according to claim 17, wherein the first region is formed by one of a shallow diffusion and implantation process and the second region is formed by a deep diffusion process.

21. The optoelectronic integrated circuit according to claim 17, wherein the light-receiving device further comprises a separation layer, which is formed on the substrate to provide electrical insulation between the substrate and the intrinsic region.

22. The optoelectronic integrated circuit according to claim 21, wherein the separation layer is formed on the substrate by $O_2$ implantation.

23. The optoelectronic integrated circuit according to claim 22, wherein the substrate is a silicon-based substrate and the intrinsic region is formed by regrowth of a silicon-based material.

24. The optoelectronic integrated circuit according to claim 21, wherein the substrate is a silicon-based substrate and the intrinsic region is formed by regrowth of a silicon-based material.

25. The optoelectronic integrated circuit according to claim 21, wherein the light-receiving device has a structure with a plurality of light-receiving regions, each of which comprises the intrinsic region, the first region, and the second region, and an isolation region is formed between the light-receiving regions for electrical insulation therebetween.

26. The optoelectronic integrated circuit according to claim 25, which is used as at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

27. The optoelectronic integrated circuit according to claim 21, which is used as at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

28. The optoelectronic integrated circuit according to claim 17, wherein the substrate is a silicon-based substrate and the intrinsic region is formed by regrowth of a silicon-based material.

29. The optoelectronic integrated circuit according to claim 17, which is used as at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

30. The optoelectronic integrated circuit according to claim 29, wherein when the light-receiving device is positioned in a two-dimensional array, the optoelectronic integrated circuit is used as a monochromatic or color imaging device.

31. The method according to claim 17, wherein the first region has a depth of 50 nm.

32. An optoelectronic integrated circuit comprising at least one light-receiving device for receiving light formed on a substrate, wherein the
light-receiving device comprises:
an intrinsic region formed on the substrate;
a first region formed to a relatively shallow depth in the intrinsic region; and
a second region formed to a relatively deep depth in the intrinsic region and distanced from the first region, the first and second regions being doped with different conductivity types, wherein the first region is doped with p+ type and comprise thereon an electrode patterned in such a way as to be in discontinuous contact with the first region, wherein the electrode is a light-transmittable dielectric electrode.

33. The optoelectronic integrated circuit according to claim 32, wherein a discontinuous control film pattern with a plurality of openings is formed on a part of the surface of the intrinsic region intended for the formation of the first region, the first region is formed to a relatively shallow depth using the openings of the control film pattern, and the dielectric electrode is in contact with the first region at the openings of the control film pattern.

34. The optoelectronic integrated circuit according to claim 33, wherein the control film is a silicon oxide film.

35. The optoelectronic integrated circuit according to claim 33, wherein the first region is formed by one of a shallow diffusion process and/or implantation process and the second region is formed by a deep diffusion process.

36. A method for manufacturing a light-receiving device, the method comprising:
preparing a substrate;
forming an intrinsic region on the substrate; and
forming first and second regions in the intrinsic region to relatively shallow and deep depths, respectively, wherein the first and second regions are distanced from each other and doped with different conductivity types;
forming a discontinuous control film pattern with a plurality of openings located on the first region; and
forming an electrode in physical contact with the first region at a plurality of locations through the plurality of openings of the discontinuous control film,
wherein the first region is formed to a relatively shallow depth using the openings of the control film pattern.

37. The method according to claim 36, wherein the first region is doped with p+ type.

38. The method according to claim 36, wherein the step of forming the discontinuous control film pattern with a plurality of openings includes forming the discontinuous control film on a part of the surface of the intrinsic region intended for the formation of the first region, wherein the first region is formed to a relatively shallow depth using the openings of the control film pattern.

39. The method according to claim 38, wherein the control film is a silicon oxide film.

40. The method according to claim 38, wherein the first region is formed by one of a shallow diffusion process and/or implantation process and the second region is formed by a deep diffusion process.

41. The method according to claim 36, further comprises forming a silicon oxide film for preventing the exposure of the intrinsic region.

42. The method according to claim 36, wherein the first region is formed by one of a shallow diffusion process and/or implantation process and the second region is formed by a deep diffusion process.

43. The method according to claim 36, further comprising forming a separation layer on the substrate to provide electrical insulation between the substrate and the intrinsic region before the formation of the intrinsic region.

44. The method according to claim 43, wherein the separation layer is formed on the substrate by $O_2$ implantation.

45. The method according to claim 44, wherein the substrate is a silicon-based substrate and the intrinsic region is formed by regrowth of a silicon-based material.

46. The method according to claim 43, wherein the substrate is a silicon-based substrate and the intrinsic region is formed by regrowth of a silicon-based material.

47. The method according to claim 36, wherein the substrate is a silicon-based substrate and the intrinsic region is formed by regrowth of a silicon-based material.

48. The method according to claim 36, wherein when the light-receiving device comprise a one- or two-dimensional array of a plurality of light-receiving regions, each of which has the intrinsic region and first and second regions, the method further comprises forming an isolation region between the light-receiving regions for electrical insulation therebetween.

49. The method according to claim 36, wherein the substrate is used as a base for at least one selected from a light-receiving device for optical communication, a light-receiving device for optical pick-up, an optical module for optical communication with an integral structure of a semiconductor laser and a light-receiving device, an optical module for optical pick-up, various optical benches with light-receiving devices, and various optoelectronic integrated circuits with a single light-receiving device or a one- or two-dimensional array of a plurality of light-receiving devices.

50. A method for manufacturing a light-receiving device, the method comprising:
   preparing a substrate;
   forming an intrinsic region on the substrate; and
   forming first and second regions in the intrinsic region to relatively shallow and deep depths, respectively, wherein the first and second regions are distanced from each other and doped with different conductivity types;
   forming on the first region an electrode patterned in such a way as to be in discontinuous contact with the first region and wherein the first region is doped with p+ type,
   wherein the electrode is a light-transmittable dielectric electrode.

51. A method for manufacturing a light-receiving device, the method comprising:
   preparing a substrate;
   forming an intrinsic region on the substrate;
   forming first and second regions in the intrinsic region to relatively shallow and deep depths, respectively, wherein the first and second regions are distanced from each other and doped with different conductivity types, wherein when the light-receiving device comprise a one- or two-dimensional array of a plurality of light-receiving regions, each of which has the intrinsic region and first and second regions; and
   forming an isolation region between the light-receiving regions for electrical insulation therebetween, wherein the isolation region is formed of an insulation film and poly-Si.

* * * * *